United States Patent
Chang et al.

(10) Patent No.: US 7,649,207 B2
(45) Date of Patent: Jan. 19, 2010

(54) THIN FILM TRANSISTOR

(75) Inventors: Chih-Hsiung Chang, Taichung County (TW); Chien-Shen Weng, Hsinchu County (TW); Chieh-Chou Hsu, Kaohsiung (TW); Chia-Tien Peng, Hsinchu County (TW); Jhen-Yue Li, Taichung (TW)

(73) Assignee: Au Optronics Corp., Hsinchu (TW)

( * ) Notice: Subject to any disclaimer, the term of this patent is extended or adjusted under 35 U.S.C. 154(b) by 424 days.

(21) Appl. No.: 11/610,541

(22) Filed: Dec. 14, 2006

(65) Prior Publication Data

US 2007/0267635 A1    Nov. 22, 2007

(30) Foreign Application Priority Data

May 17, 2006    (TW) .............................. 95117431 A

(51) Int. Cl.
*H01L 27/14* (2006.01)
*H01L 29/04* (2006.01)
*H01L 29/15* (2006.01)
*H01L 31/036* (2006.01)

(52) U.S. Cl. .................... 257/72; 257/59; 257/E27.001

(58) Field of Classification Search .................. 257/59, 257/72
See application file for complete search history.

(56) References Cited

U.S. PATENT DOCUMENTS

| 6,468,822 | B2 * | 10/2002 | Maeda et al. ................. 438/30 |
| 6,537,843 | B2 | 3/2003 | Lyu et al. |
| 6,894,313 | B2 | 5/2005 | Park et al. |
| 2002/0042167 | A1 * | 4/2002 | Chae .......................... 438/149 |
| 2002/0117691 | A1 * | 8/2002 | Choi et al. ................... 257/225 |
| 2002/0142554 | A1 | 10/2002 | Nakajima |
| 2004/0251463 | A1 | 12/2004 | Park et al. |
| 2005/0056934 | A1 | 3/2005 | Suzawa et al. |
| 2005/0067618 | A1 | 3/2005 | Nakajima et al. |
| 2005/0095772 | A1 | 5/2005 | Ishikawa |
| 2005/0110016 | A1 | 5/2005 | Yamazaki |
| 2005/0266593 | A1 | 12/2005 | Suzawa et al. |
| 2006/0263949 | A1 * | 11/2006 | Tsai et al. .................... 438/149 |

FOREIGN PATENT DOCUMENTS

| CN | 1282107 | 1/2001 |
| CN | 1574354 | 2/2005 |
| EP | 1071124 | 1/2001 |

OTHER PUBLICATIONS

CN Office Action mailed Dec. 21, 2007.
TW Office Action mailed Apr. 29, 2008.
"ULSI Technology International Editions 1996" C. Y. Chang; Copyright 1996 by The McGraw-Hill Companies, Inc.; Printed in Singapore.

* cited by examiner

*Primary Examiner*—Kenneth A Parker
*Assistant Examiner*—Anthony Ho
(74) *Attorney, Agent, or Firm*—Thomas, Kayden, Horstemeyer & Risley

(57) ABSTRACT

A thin film transistor is disclosed, comprising a substrate, a polysilicon layer overlying the substrate, a gate insulating layer overlying the polysilicon layer, a gate electrode, a dielectric interlayer overlying the gate electrode and gate insulating layer, and a source/drain electrode overlying the dielectric interlayer. Specifically, the gate electrode comprises a first electrode layer overlying the gate insulating layer and a second electrode layer essentially overlying an upper surface of the first electrode layer. The first and second electrode layers each has substantially the same profile with a taper angle of less than about 90 degrees.

19 Claims, 10 Drawing Sheets

THIN FILM TRANSISTOR

BACKGROUND OF THE INVENTION

1. Field of the Invention

The invention relates to a thin film transistor, and more particularly to a thin film transistor (TFT) for a low temperature polysilicon (LTPS) display.

2. Description of the Related Art

As shown in FIG. 1, a conventional top gate type TFT comprises a substrate 100, a polysilicon layer 102 on the substrate 100, a gate insulating layer 104 on the polysilicon layer 102, a gate electrode 106 on the gate insulating layer 104, an dielectric interlayer 108 on the gate electrode 106, and source and drain electrodes 112a, 112b electrically connected to the source and drain regions 102b and 102c of the polysilicon layer 102 by means of the plugs 110a and 110b, respectively. The gate electrode 106 may include Mo or W. Stress is typically generated during deposition of films and thermal processes and remains in or between films, e.g. between the gate electrode and gate insulating layer. Stress is also generated by material defects.

FIG. 2 shows a $V_g$-$I_d$ curve representing the relationship of gate voltage vs. drain current for a conventional thin film transistor. Referring to FIG. 2, electric properties may degrade due to the existence of stresses between the metal gate electrode and gate insulating layer. The $V_g$-$I_d$ curve apparently shifts to the negative direction of X-axis ($V_g$) when voltages of about −15~20V and 10V are respectively applied to the gate electrode and drain electrode.

As described above, it is well known that the existence of stress between the metal gate electrode and gate insulating layer may effect the stability of a thin film transistor. Accordingly, a thin film transistor with stable electrical properties and operation is desirable.

BRIEF SUMMARY OF THE INVENTION

Thin film transistors are provided. An exemplary embodiment of a thin film transistor comprises: a substrate; a polysilicon layer comprising a channel region disposed between a source region and a drain region overlying the substrate; a gate insulating layer over the polysilicon layer; a gate electrode overlying the gate insulating layer, opposite to the channel region; an dielectric interlayer over the gate electrode and the gate insulating layer; source and drain electrodes overlying the dielectric interlayer, electrically connected to the source and drain regions, respectively. Specifically, the gate electrode comprises a first electrode layer overlying the gate insulating layer and a second electrode layer essentially overlying an upper surface of the first electrode layer the first and second electrode layers share substantially the same and each comprises a taper angle of less than about 90 degrees.

Another embodiment of a thin film transistor comprises: a substrate; a polysilicon layer overlying the substrate; a gate insulating layer over the polysilicon layer; a gate electrode overlying the gate insulating layer, opposite to the channel region; an dielectric interlayer over the gate electrode and the gate insulating layer; source and drain electrodes overlying the dielectric interlayer, electrically connected to the source and drain regions, respectively. The polysilicon layer has channel region disposed between a source region and a drain region. The source and drain regions have substantially the same and uniform concentration of doped ions. Specifically, the gate electrode comprises a first electrode layer overlying the gate insulating layer and a second electrode layer overlying the first electrode layer.

In the present invention, a single-layer metal gate is replaced with a multi-layer metal gate comprising metals of capable of sustaining various levels and types of stress or Young's modulus, thus the stresses between the metal gate electrode and gate insulating layer can be reduced and the stability of thin film transistor can be enhanced. Moreover, in the described metal gate, each underlying metal layer has a Young's modulus less than that of the overlying ones.

The invention in its various embodiments is suitable for various metal oxide semiconductors (MOS) e.g. n-type metal oxide semiconductors (NMOS), p-type metal oxide semiconductors (PMOS) or complementary metal oxide semiconductors (CMOS).

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the present invention. This description is made for the purpose of illustrating the general principles of the invention and should not be taken in a limiting sense. The scope of the invention is best determined by reference to the appended claims.

Figure 1:
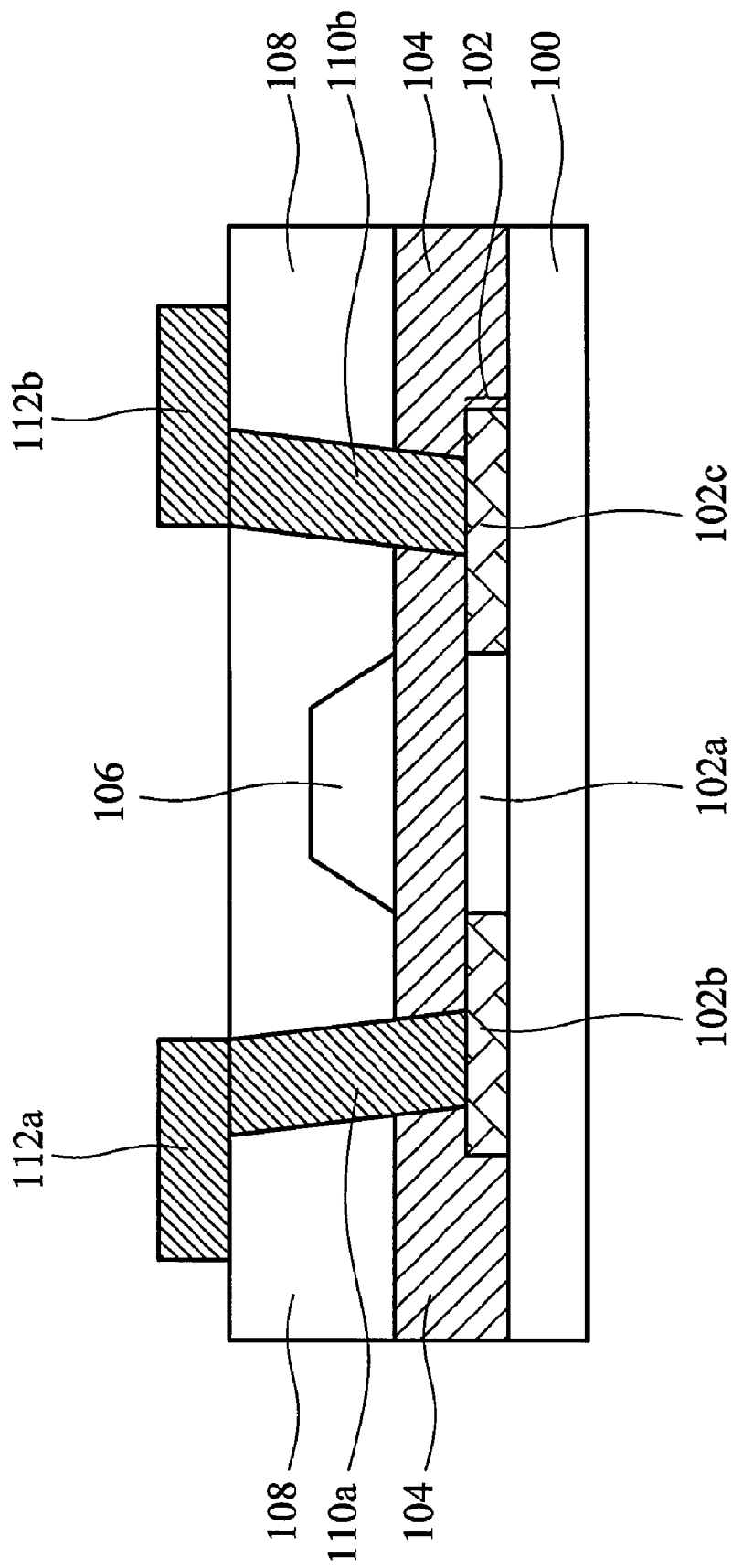
FIG. 1 shows constitution of a conventional thin film transistor.
Figure 2:
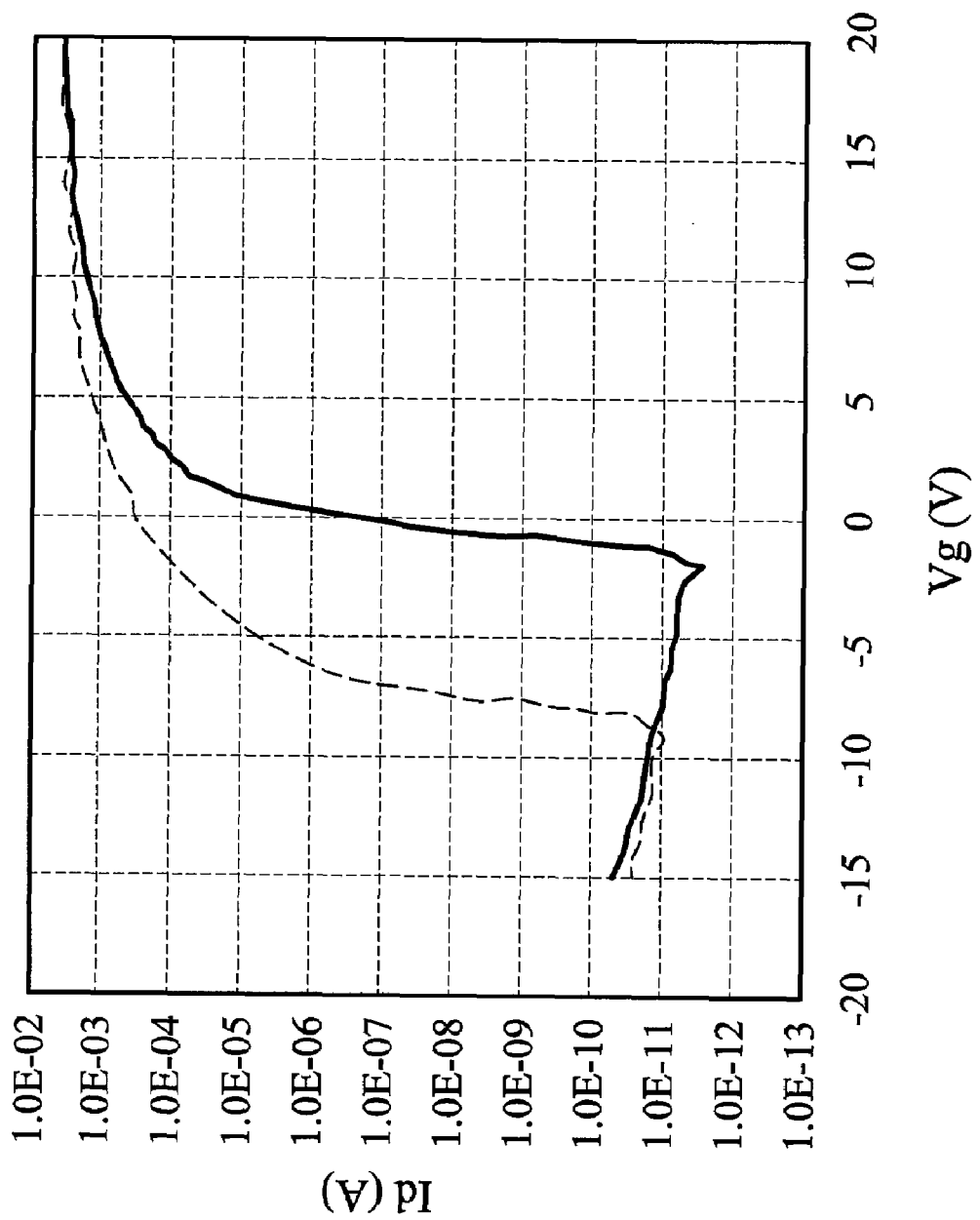
FIG. 2 shows a $V_g$-$I_d$ curve representing the relationship of gate voltage vs. drain current for a conventional thin film transistor.
Figure 3:
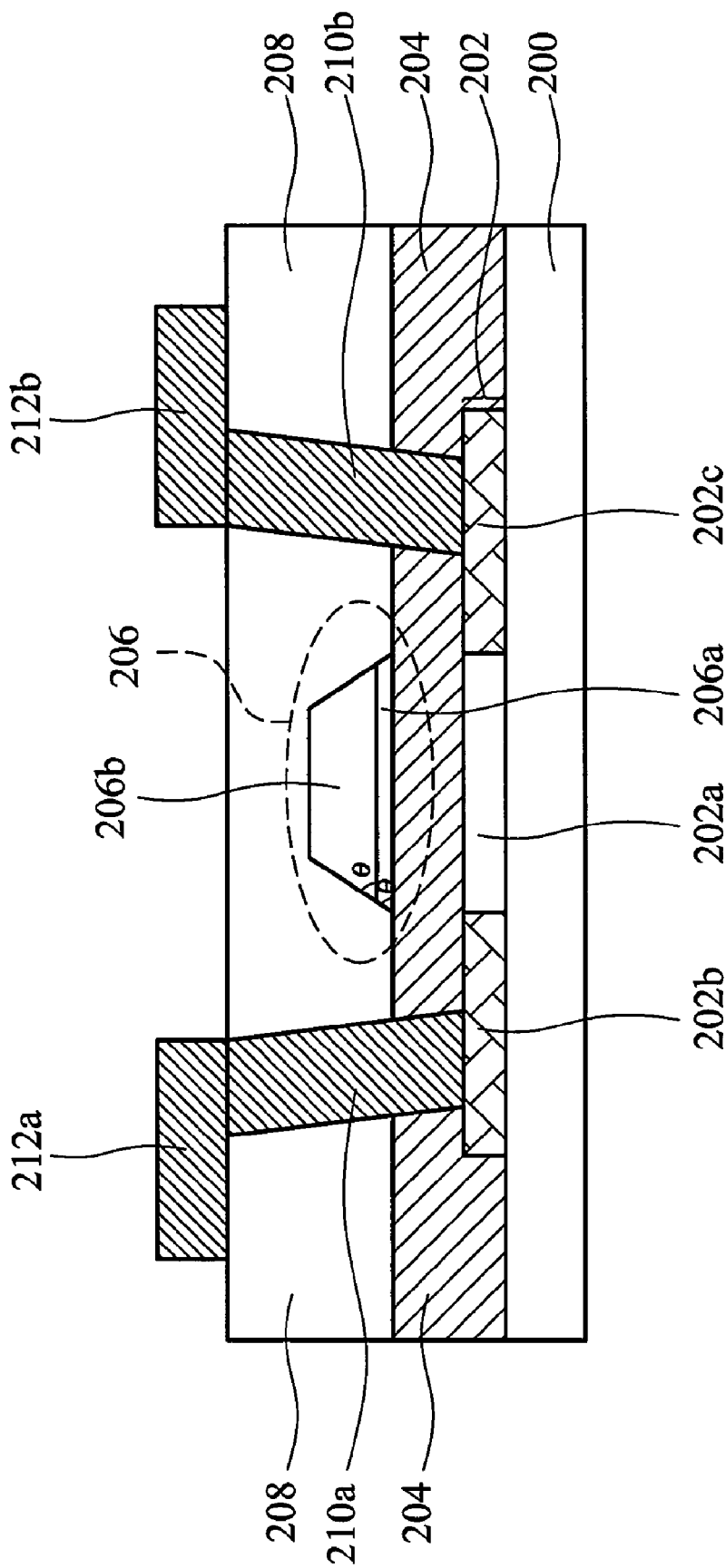
FIG. 3 shows an embodiment of a thin film transistor.

FIG. 3 shows an embodiment of a top gate type TFT comprising: a substrate 200; a polysilicon layer 202 on the substrate 200; a gate insulating layer 204 on the polysilicon layer 202; a gate electrode 206 on the gate insulating layer 204; an dielectric interlayer 208 on the gate electrode 206, and source and drain electrodes 212a and 212b electrically connected to the polysilicon layer 202 via plugs 210a and 210b, respectively. The polysilicon layer 202 only has three regions. The polysilicon layer 202 comprises a channel region 202a between the source region 202b, a drain region 202c. The gate electrode 206 is opposite to the channel region 202a against the gate insulating layer 204. The source and drain electrodes 212a, 212b are electrically connected to the source and drain regions 202b, 202c, respectively.

Specifically, the gate electrode 206 comprises a first electrode layer 206a overlying the gate insulating layer 204 and a second electrode layer 206b essentially overlying an upper surface of the first electrode layer 206a. The first and second electrode layers 206a and 206b have substantially the same profile and each has a taper angle of θ less than about 90 degrees. That is, at least one of the first and second electrode layers 206a and 206b comprises a multi-layer gate electrode 206 instead of a single-layer metal gate. The taper angle θ is from about 20 to about 60 degrees, or from about 15 to about 60 degrees.

In addition, the first electrode layer 206a has a Young's modulus different from that of the second electrode layer 206b. Preferably, the first electrode layer 206a has a Young's modulus less than that of the second electrode layer 206b, and has a thickness of about 50 to about 700 angstroms or about 100 to about 500 angstroms.

The first electrode layer 206a can be titanium or aluminum. The second electrode layer 206b can be molybdenum, titanium, tungsten, or aluminum. Furthermore, the second electrode layer 206b has a thickness of about 1000 to about 4000 angstroms, preferably of about 1000 to about 4000 angstroms. As a result, the gate electrode has a total thickness of about 1000 to about 4500 angstroms, preferably of about 1100 to about 3500 angstroms. The second electrode layer 206b can be metal silicide, for example, nickel silicide (NiSi), titanium silicide (TiSi$_2$) or cobalt silicide (CoSi). The polysilicon layer 202 can be an n-type polysilicon layer or a p-type polysilicon layer.

In this embodiment, the thin film transistor further comprises a buffer layer (not shown) between the substrate and the polysilicon layer. The gate electrode 206 further comprises a third electrode layer (not shown) on the second electrode layer 206b, and can be titanium, molybdenum or molybdenum tungsten.

As shown in Table 1, a stress rendered by molybdenum or tungsten is larger than that rendered by titanium or aluminum because molybdenum or tungsten has a larger Young's modulus.

TABLE 1

| Elastic property | aluminum | titanium | molybdenum | tungsten |
| --- | --- | --- | --- | --- |
| Young's modulus (Gpa) | 70 | 116 | 329 | 411 |

Figure 4:
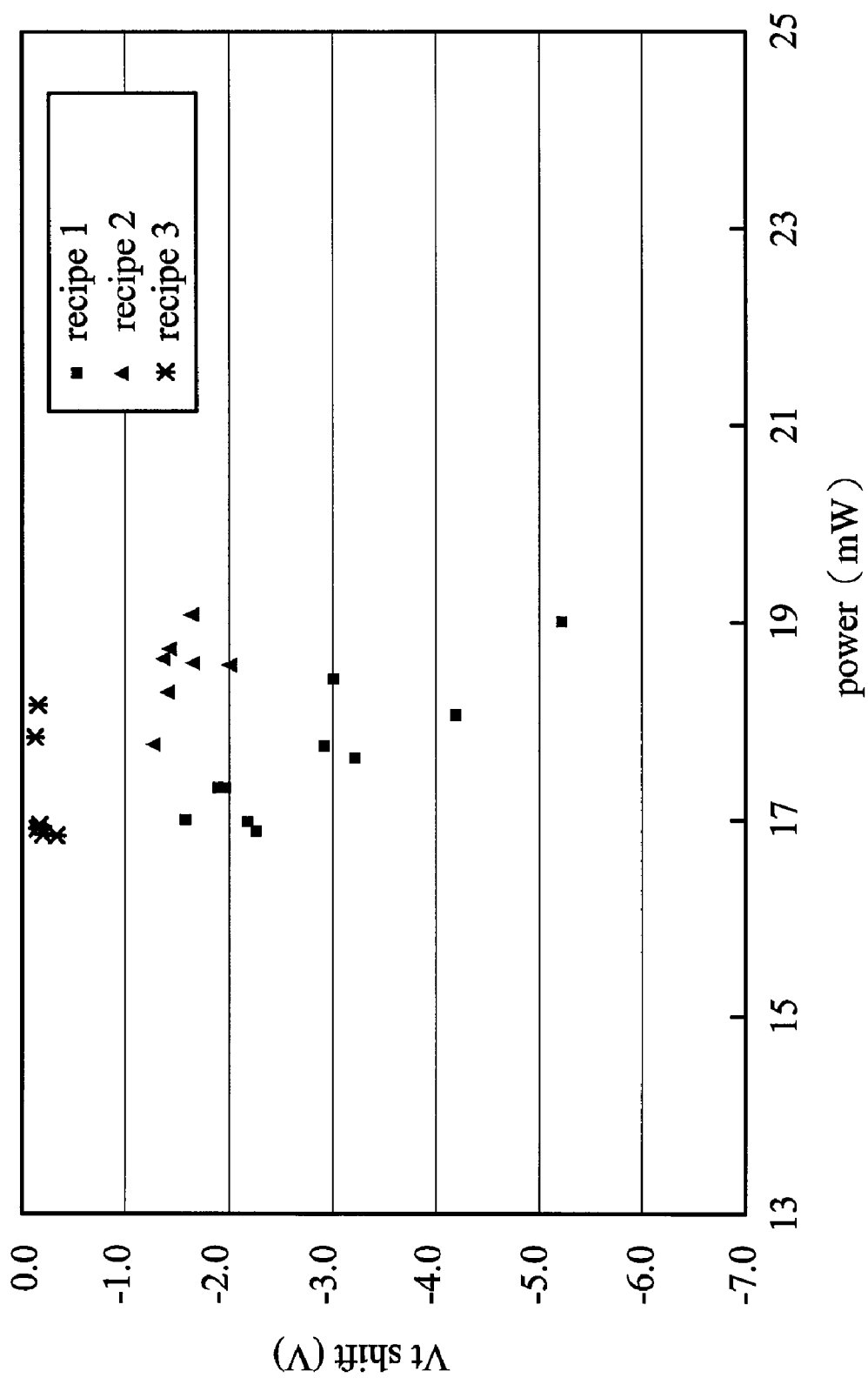
FIG. 4 shows the relationship of threshold voltage shift vs. power for the thin film transistor showed in FIG. 3.

For example, stresses existing in the molybdenum film vary with the different sputtering recipes at room temperature. When an r-type thin film transistor comprises a single-layer gate molybdenum electrode, a threshold voltage shift becomes larger with increased power, as shown in FIG. 4.

Figure 5:
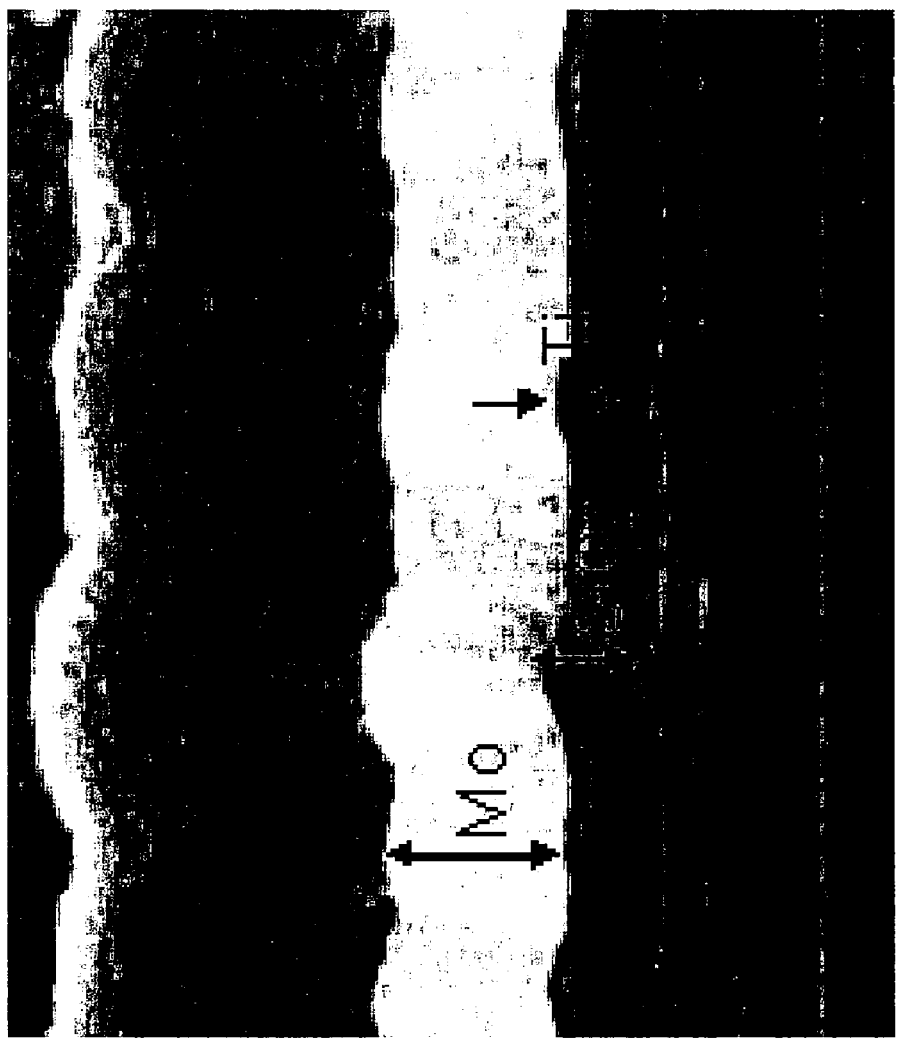
FIG. 5 shows SEM cross-sectional views of the thin film transistor of FIG. 3.
Figure 6:
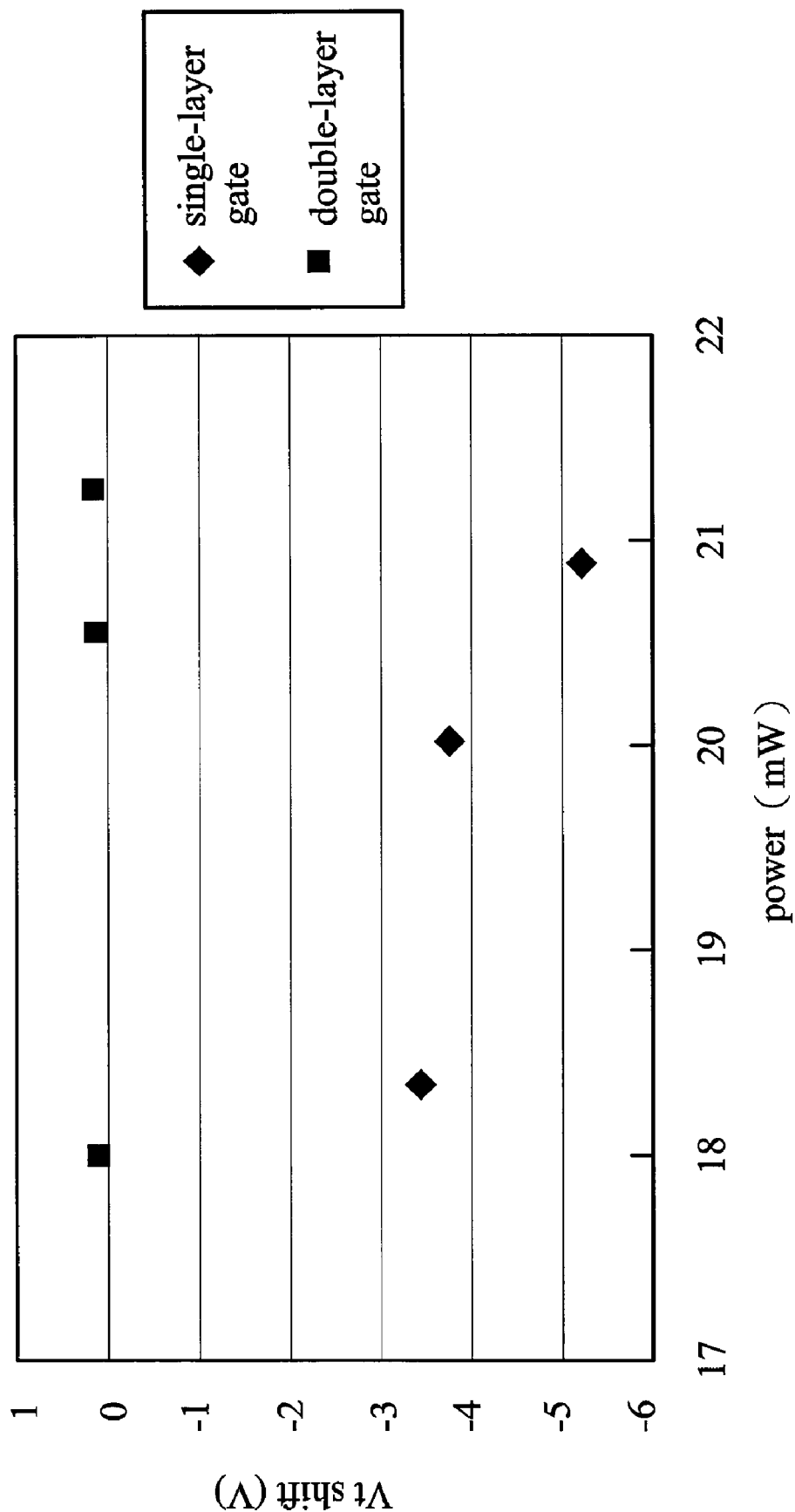
FIG. 6 shows the relationship of threshold voltage shift vs. power for the thin film transistor of FIG. 3 at room temperature, pointing out the difference between the inventive and conventional thin film transistors.
Figure 7:
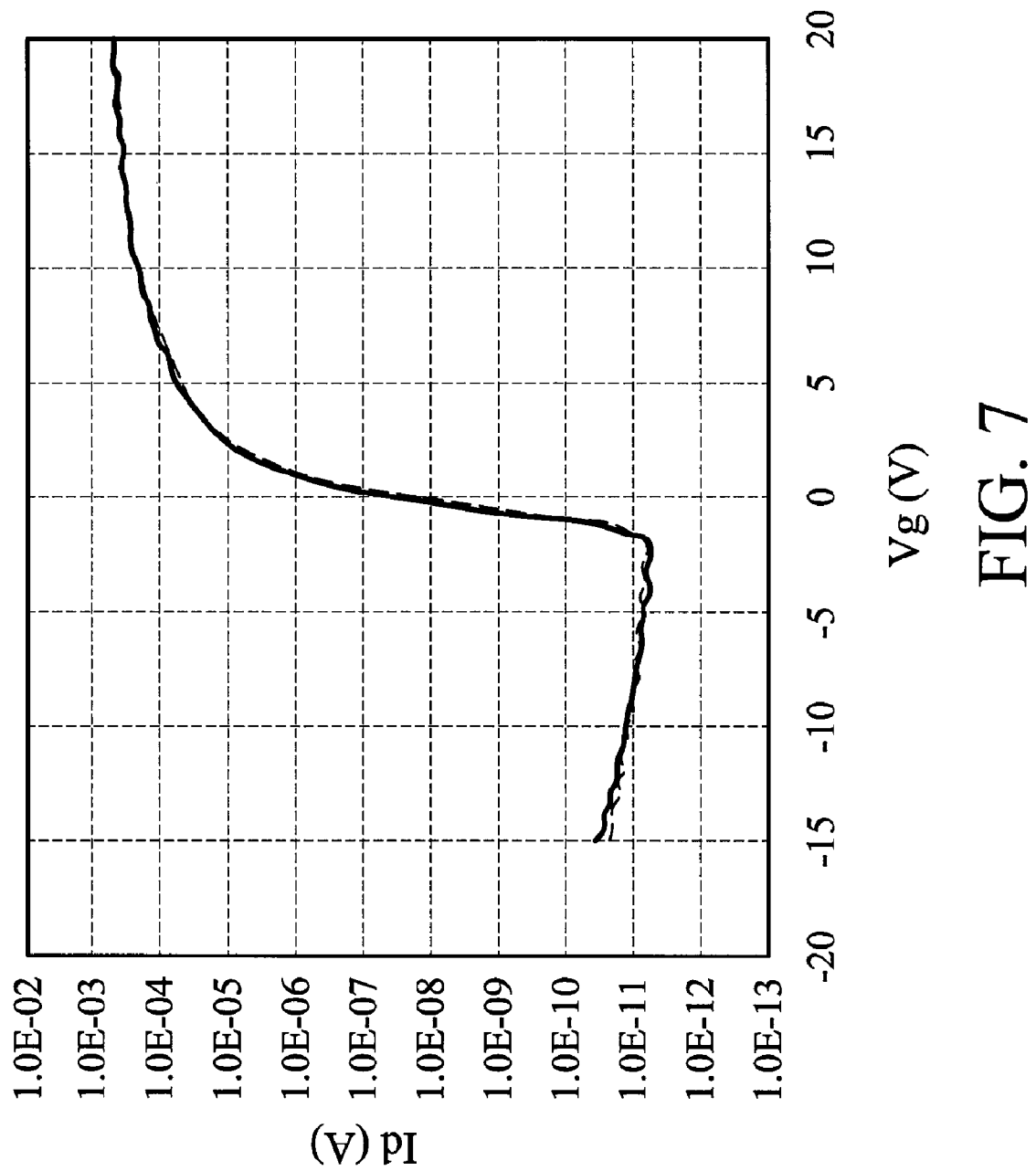
FIG. 7 shows an embodiment of a $V_g$-$I_d$ curve representing the relationship of gate voltage vs. drain current for a thin film transistor at room temperature.
Figure 8:
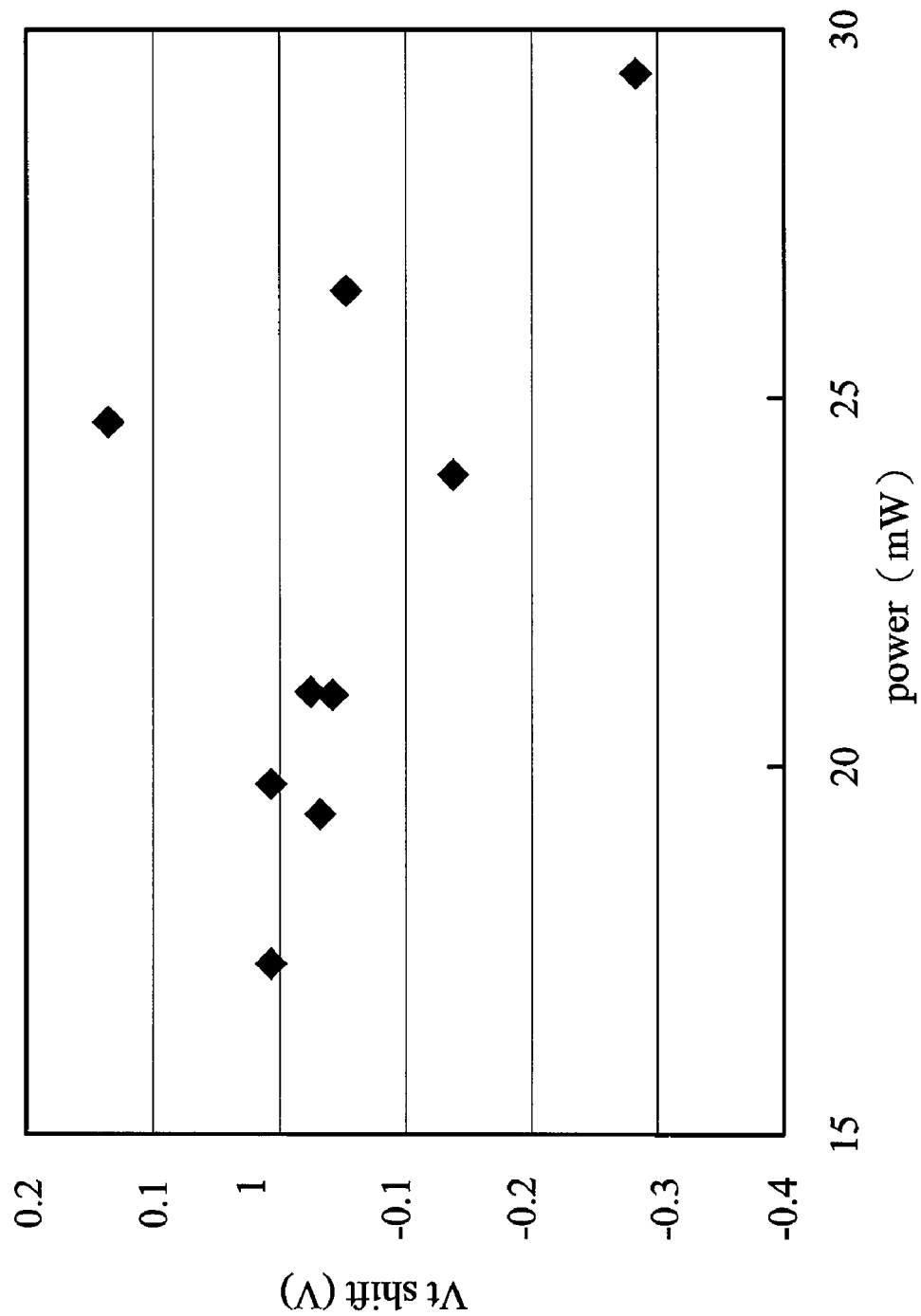
FIG. 8 shows an embodiment of the relationship of threshold voltage shift vs. power for a thin film transistor at 70° C.

As shown in FIG. 5, however, a first electrode layer 206a (for example, titanium) is sandwiched between the second electrode layer 206b (similar to the single-layer gate molybdenum electrode) and the gate dielectric layer (for example silicon oxide). Thicknesses of the second and first electrode layers 206b and 206a are about 2000 and about 100 angstroms, respectively. In addition, the sample of FIG. 5 is pre-treated with HF aqueous solution, and then proceeds with a reliability test. FIG. 6 shows an n-type thin film transistor with double-layer gate electrode of this embodiment having a threshold voltage shift less than 0.3V while one with a single-layer metal gate electrode (composed of 2000 angstroms thick molybdenum) has a threshold voltage shift far greater than 3V. As shown in FIG. 7, $I_d$-$V_g$ (i.e. drain current vs. gate voltage) curves for the n-type thin film transistor with double-layer gate electrode of this embodiment matches (no shift) after repetition of measurement at room temperature. In addition, as shown in FIG. 8, an n-type thin film transistor with double-layer gate electrode composed of titanium and molybdenum also has a threshold voltage shift less than 0.3V.

TABLE 2

|  | Recipe 1 | Recipe 2 | Recipe 3 |
| --- | --- | --- | --- |
| Power (kW) | 2.75 | 8 | 11 |

Figure 9:
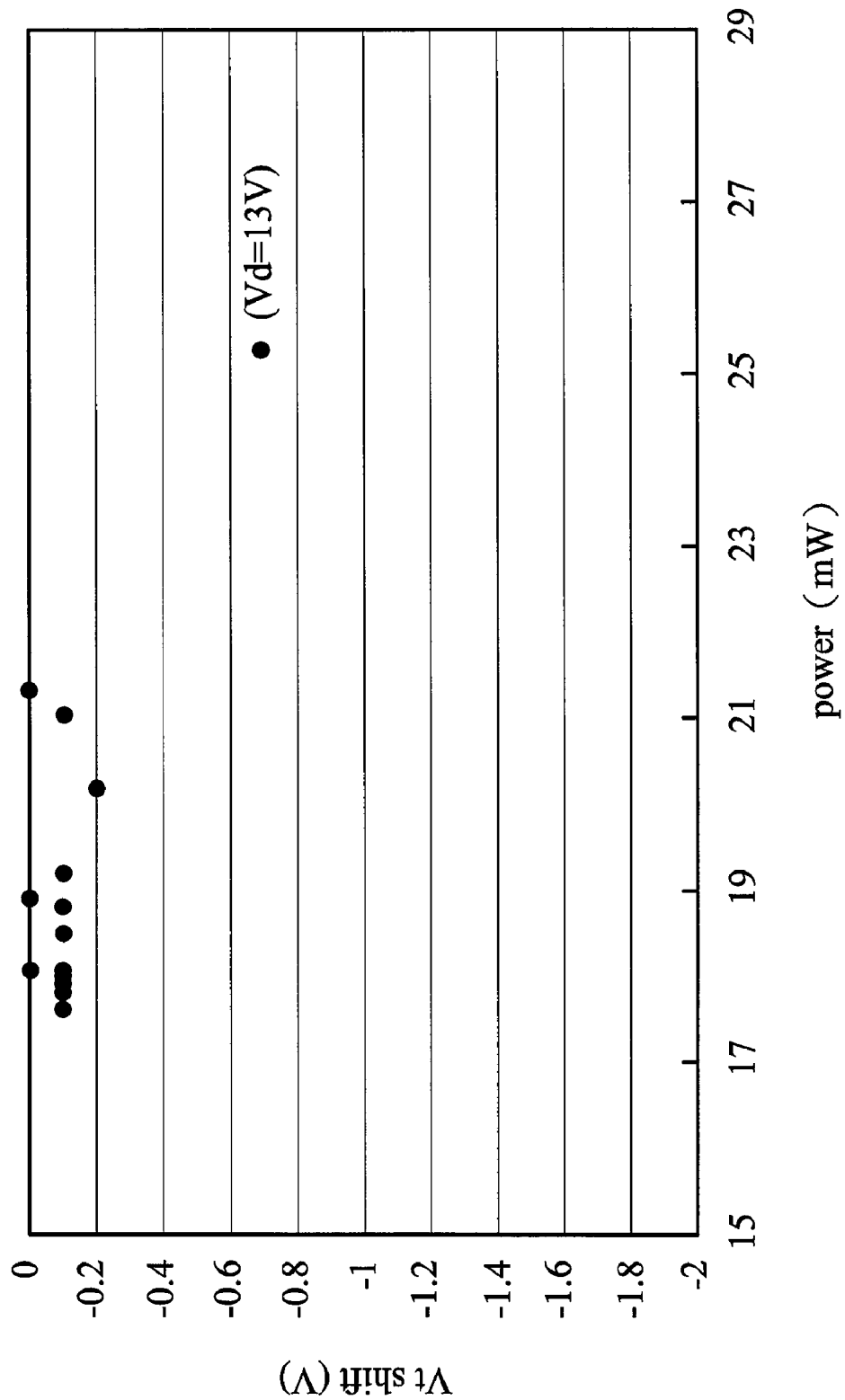
FIG. 9 shows another embodiment of the relationship of threshold voltage shift vs. power for a thin film transistor at 70° C.
Figure 10:
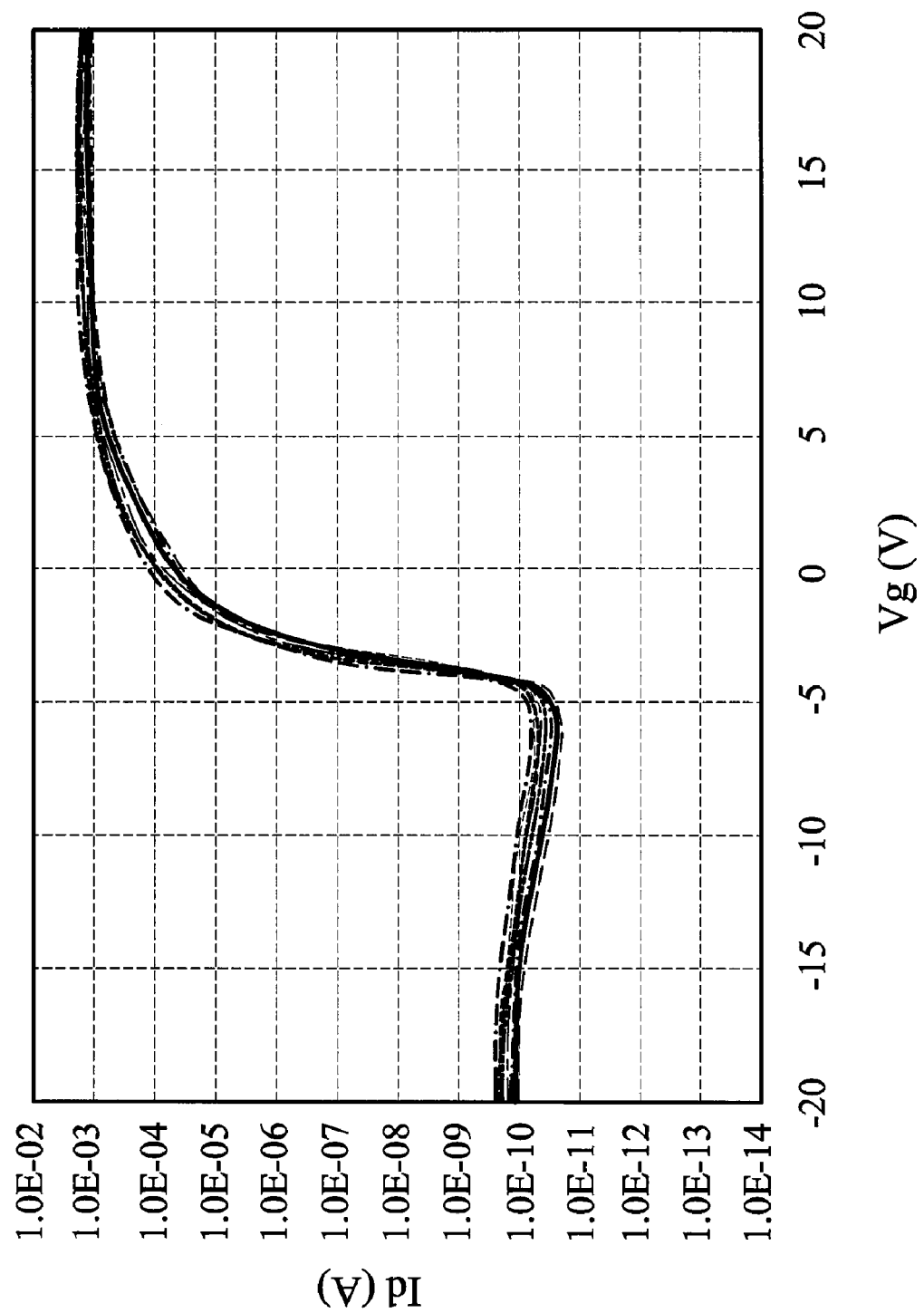
FIG. 10 shows another embodiment of a $V_g$-$I_d$ curve representing the relationship of gate voltage vs. drain current for a thin film transistor at room temperature.

In another embodiment, titanium is replaced by aluminum, and serves as the first electrode layer 206a, and the n-type thin film transistor with double-layer gate electrode comprises aluminum of 500 angstroms thick and molybdenum of 1500 angstroms thick. As shown in FIG. 9, measured at 70° C., the threshold voltage shift is less than 0.3V when the power is less than 23 mV; the threshold voltage shift is less than 0.8V even when the power is up to 23 mV. A threshold voltage shift of 0.8V is still less than that of a typical single-layer metal gate electrode. Furthermore, FIG. 10 shows another embodiment of a $V_g$-$I_d$ curve representing the relationship of gate voltage vs. drain current for a thin film transistor at room temperature. It can be realized from FIG. 10 that the n-type thin film transistor with double-layer gate electrode comprising aluminum and molybdenum has good stability.

In the invention, a single-layer metal gate is replaced with a multilayer metal gate comprising metals of different stress or Young's modulus, thus, the stresses between the metal gate electrode and gate insulating layer can be reduced and the stability of thin film transistor is enhanced. Moreover, in the metal gate of these embodiments, each underlying metal layer has a Young's modulus less than that of the overlying layers.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thin film transistor, comprising
a substrate;
a polysilicon layer formed on the substrate, wherein the polysilicon layer comprises a source region, a drain region and a channel region located therebetween, and the source region has a uniform concentration of doped ions, wherein the uniform concentration of doped ions is substantially the same as that of the drain region, and wherein the channel region is directly connected with the source region and the drain region;
a gate insulating layer formed on the polysilicon layer;
a gate electrode formed on the gate insulating layer, comprising:
a first electrode layer formed on the gate insulating layer; and
a second electrode layer formed on the first electrode layer, substantially overlay a top surface of the first electrode layer, wherein each of the first and second electrode layers has a taper angle of less than about 90 degrees;
a dielectric interlayer formed on the gate electrode and the gate insulating layer; and source and drain electrodes formed on the dielectric interlayer, electrically connected to the source and drain regions, respectively, wherein the first electrode layer has a Young's modulus different from that of the second electrode layer.

2. The thin film transistor as claimed in claim 1, wherein the Young's modulus of the first electrode layer is less than that of the second electrode layer.

3. The thin film transistor as claimed in claim 1, wherein the first electrode layer has a thickness of about 50 to about 700 angstroms.

4. The thin film transistor as claimed in claim 1, wherein the first electrode layer has a thickness of about 100 to about 500 angstroms.

5. The thin film transistor as claimed in claim 1, wherein the first electrode layer is comprised of titanium or aluminum.

6. The thin film transistor as claimed in claim 1, wherein the second electrode layer has a thickness of about 1000 to about 4000 angstroms.

7. The thin film transistor as claimed in claim 1, wherein the gate electrode has a thickness of about 1000 to about 4500 angstroms.

8. The thin film transistor as claimed in claim 1, wherein the second electrode layer is comprised of molybdenum, titanium, tungsten or aluminum.

9. The thin film transistor as claimed in claim 1, wherein the second electrode layer is comprised of metal silicide.

10. The thin film transistor as claimed in claim 1, wherein the polysilicon layer is comprised of N-type or P-type polysilicon.

11. The thin film transistor as claimed in claim 1, further comprising:
a buffer layer formed between the substrate and the polysilicon layer.

12. The thin film transistor as claimed in claim 1, wherein the taper angle is about 20 to about 60 degrees.

13. The thin film transistor as claimed in claim 1, wherein the gate electrode further comprises a third electrode layer formed on the second electrode layer.

14. A thin film transistor, comprising:
a substrate;
a polysilicon layer formed on the substrate, wherein the polysilicon layer has a source region, a drain region and a channel region located therebetween, and the source region has a uniform concentration of doped ions, wherein the uniform concentration of doped ions is substantially the same as that of the drain region, and wherein the channel region is directly connected with the source region and the drain region;
a gate insulating layer formed on the polysilicon layer;
a gate electrode formed on the gate insulating layer, comprising:
a first electrode layer formed on the gate insulating layer; and
a second electrode layer formed on the first electrode layer;
an dielectric interlayer formed on the gate electrode and the gate insulating layer; and
source and drain electrodes formed on the dielectric interlayer, electrically connected to the source and drain regions, respectively.

15. The thin film transistor as claimed in claim 14, wherein the first electrode layer has a Young's modulus less than that of the second electrode layer.

16. The thin film transistor as claimed in claim 14, wherein each of the first and second electrode layers has a taper angle of less than about 90 degrees.

17. The thin film transistor as claimed in claim 16, wherein the taper angle is about 20 to about 60 degrees.

18. The thin film transistor as claimed in claim 14, wherein the first electrode layer has a thickness of about 50 to about 700 angstroms.

19. The thin film transistor as claimed in claim 14, wherein the second electrode layer has a thickness of about 1000 to about 4000 angstroms.

* * * * *